(12) United States Patent
Kan et al.

(10) Patent No.: US 10,594,058 B2
(45) Date of Patent: Mar. 17, 2020

(54) TERMINAL BLOCK AND ELECTRONIC APPLIANCE

(71) Applicant: TDK CORPORATION, Tokyo (JP)

(72) Inventors: Masaki Kan, Tokyo (JP); Han Wu, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/021,787

(22) Filed: Jun. 28, 2018

(65) Prior Publication Data

US 2019/0006775 A1 Jan. 3, 2019

(30) Foreign Application Priority Data

Jun. 29, 2017 (JP) ................................. 2017-126900

(51) Int. Cl.
*H01R 9/22* (2006.01)
*H01R 9/24* (2006.01)
(Continued)

(52) U.S. Cl.
CPC .................. *H01R 9/24* (2013.01); *H01R 9/18* (2013.01); *H01R 9/223* (2013.01); *H01R 11/28* (2013.01); *H01R 12/515* (2013.01); *H05K 5/0247* (2013.01); *H01R 43/24* (2013.01); *H01R 2201/26* (2013.01); *H05K 2201/10409* (2013.01)

(58) Field of Classification Search
CPC ........ H01R 33/22; H01R 9/24; H01R 13/719; H01R 13/7195; H01R 13/6616
USPC ........... 439/707, 709, 620.09, 620.1, 620.13, 439/620.21
See application file for complete search history.

(56) References Cited

U.S. PATENT DOCUMENTS 3,851,220 A * 11/1974 Charles ..................... H01T 4/06
361/120
4,063,339 A * 12/1977 Splitt ......................... H01T 1/14
445/33

(Continued)

FOREIGN PATENT DOCUMENTS

| CN | 202333335 | 7/2012 |
| CN | 104009323 | 8/2014 |

(Continued)

OTHER PUBLICATIONS

Office Action issued in China Counterpart Patent Appl. No. 201810637360.0, dated Sep. 17, 2019 (with an English translation thereof).

*Primary Examiner* — Thanh Tam T Le
(74) *Attorney, Agent, or Firm* — Greenblum & Bernstein, P.L.C.

(57) ABSTRACT

A terminal block includes: a nonconductive main body that is attached to a structure; a main terminal that is conductive, passes through the main body, and is disposed on the main body so that both ends of the main terminal project from the main body; a capacitor that is sealed inside the main body; a first connecting conductor that connects one lead terminal of the capacitor and the main terminal; and a second connecting conductor that connects another lead terminal of the capacitor and a conductor of the structure. The first connecting conductor is entirely sealed inside the main body in a state where one end is connected to the main terminal and another end is connected to the one lead terminal of the capacitor.

14 Claims, 7 Drawing Sheets

(51) Int. Cl.
*H01R 9/18* (2006.01)
*H01R 12/51* (2011.01)
*H05K 5/02* (2006.01)
*H01R 11/28* (2006.01)
*H01R 43/24* (2006.01)

(56) References Cited

U.S. PATENT DOCUMENTS

| | | | | |
|---|---|---|---|---|
| 4,188,561 | A * | 2/1980 | Pranke | H01T 1/14 313/231.11 |
| 5,224,013 | A * | 6/1993 | Pagliuca | H01T 4/06 337/32 |
| 5,550,415 | A | 8/1996 | Adachi et al. | |
| 6,095,867 | A * | 8/2000 | Brandt | H01R 12/675 439/502 |
| 6,291,913 | B1 | 9/2001 | Nikawa et al. | |
| 6,371,791 | B1 * | 4/2002 | Newton, Jr. | H01R 13/7195 439/2 |
| 6,884,119 | B2 * | 4/2005 | Brooks | H01R 13/719 439/620.01 |
| 7,081,018 | B2 * | 7/2006 | Nagaoka | H01R 4/2429 333/182 |
| 7,097,509 | B2 * | 8/2006 | Newton, Jr. | H01R 13/7197 439/620.01 |
| 7,387,551 | B2 * | 6/2008 | Kurahashi | H01R 43/24 439/670 |
| 7,648,397 | B2 * | 1/2010 | Shimizu | H01R 4/185 439/620.21 |
| 7,874,851 | B2 * | 1/2011 | Shimizu | H01R 4/34 439/620.21 |
| 8,419,483 | B2 * | 4/2013 | Aoki | H01R 4/305 439/709 |
| 8,550,851 | B2 * | 10/2013 | Takemoto | H01R 13/6616 439/620.21 |
| 8,624,689 | B2 * | 1/2014 | Hsieh | H01R 13/6608 333/185 |
| 9,071,005 | B2 * | 6/2015 | Ikezawa | H01R 13/405 |
| 9,198,327 | B2 * | 11/2015 | Di Risio | H02K 11/024 |
| 9,847,593 | B2 * | 12/2017 | Nunner | H01R 13/42 |

FOREIGN PATENT DOCUMENTS

| | | |
|---|---|---|
| JP | 5-219704 | 8/1993 |
| JP | 3307047 | 7/2002 |
| JP | 5830858 | 11/2015 |

* cited by examiner

TERMINAL BLOCK AND ELECTRONIC APPLIANCE

FIELD OF THE INVENTION

The present invention relates to a terminal block to be attached to a structure and to an electronic appliance equipped with the terminal block.

DESCRIPTION OF THE RELATED ART

An output terminal block disclosed in Patent Literature 1 (Japanese Patent No. 5,830,858 (see pages 3 and 4 and FIGS. 1 to 3)) is known as one example of this type of terminal block. This output terminal block is attached to a case in which an electric circuit is disposed, and is an electric component for connecting a wire harness that sends electric signals outputted from the electric circuit to an external appliance. The output terminal block includes a resin main body, terminal screws, a terminal plate, and a filter capacitor. With this configuration, a base end of a terminal screw is embedded in the resin main body and the front end of the terminal screw is exposed from the resin main body and extends outside the case. A base end of the terminal plate that is formed of a band plate is embedded in the resin main body, and a front end of the terminal plate is exposed from (extends out of) the resin main body and extends inside the case and is connected to an electric circuit inside the case. The base end of the terminal plate is connected to the base end of the terminal screw inside the resin main body. Here, by fitting a terminal to which the wire harness is connected onto the front end of the terminal screw and tightening using bolts, the terminal screw is connected via the wire harness to an external appliance. By doing so, it is possible to send electrical signals outputted from the electric circuit to the external appliance.

The filter capacitor is embedded in the resin main body in a state where one end surface is exposed from the resin main body. A positive electrode terminal plate provided on the end surface (or "exposed part") of the filter capacitor is connected to the terminal screw due to the front end of the positive electrode terminal plate being inserted into the terminal screw. A negative electrode terminal plate provided on one end surface of the filter capacitor is connected to the case via bolts by inserting the bolts that hold the output terminal block to the case into the front end of the negative electrode terminal plate.

SUMMARY OF THE INVENTION

However, the terminal block described above has the following problem. In more detail, with the terminal block described above, the positive electrode terminal plate is connected to the terminal screw by merely inserting the front end of the positive electrode terminal plate provided on the filter capacitor into the terminal screw. This means that with this output terminal block, it is not possible to maintain the connection between the positive electrode terminal plate and the terminal screw when vibration or a shock is applied, and as a result of the unstable connection between the positive electrode terminal plate and the terminal screw, there is a problem in that there is the risk of poor conductivity between the positive electrode terminal plate and the terminal screw. Since the positive electrode terminal plate of the output terminal block is exposed to the outside of the resin main body, there is a further problem of the risk of poor conductivity due to corrosion of the positive electrode terminal plate.

The present invention was conceived in view of the problems described above and has a principal object of providing a terminal block and an electronic appliance capable of preventing poor conductivity between terminals and connecting conductors.

To achieve the stated object, a terminal block according to the present invention comprises: a nonconductive main body that is attached to a structure; a main terminal that is conductive, passes through the main body, and is disposed on the main body so that both ends of the main terminal project from the main body; a capacitor that is sealed inside the main body; a first connecting conductor that connects one lead terminal of the capacitor and the main terminal; and a second connecting conductor that connects another lead terminal of the capacitor and a conductor of the structure, wherein the first connecting conductor is entirely sealed inside the main body in a state where one end is connected to the main terminal and another end is connected to the one lead terminal of the capacitor.

Also, in the terminal block according to the present invention, a part of the second connecting conductor connected to the other lead terminal is sealed inside the main body.

Also, in the terminal block according to the present invention, one end of the second connecting conductor is disposed on an attachment portion, which is provided on the main body in order to attach the main body to the structure.

Also, in the terminal block according to the present invention, the main terminal is formed in an overall shape of a circular pillar.

Also, in the terminal block according to the present invention, the one end of the first connecting conductor is formed in a ring shape and one end of the ring shape is press fitted to the main terminal to connect the first connecting conductor to the main terminal.

Also, an electronic appliance according to the present invention comprises: the terminal block according to any of the above, a case as the structure to which the terminal block is attached; and an electric circuit disposed inside the case, wherein one end of the main terminal is exposed to an internal space of the case and is connected via a third connecting conductor to the electric circuit.

With the terminal block and the electronic appliance according to the present invention, the first connecting conductor is entirely sealed inside the main body in a state where one end of the first connecting conductor is connected to the main terminal and the other end of the first connecting conductor is connected to one lead terminal of the capacitor. This means that according to the above terminal block and the electronic appliance, unlike a configuration where the main terminal is connected to the first connecting conductor by merely inserting one end of the first connecting conductor into the main terminal outside the main body, that is, a conventional configuration where the connection between the main terminal and the first connecting conductor cannot be maintained (i.e., is unstable) when vibration and shocks are applied, it is possible to reliably maintain the connected state between the main terminal and the first connecting conductor even when vibration and shocks are applied to the terminal block. As a result, it is possible to reliably prevent poor conduction between the main terminal and the first connecting conductor. Also, according to the above terminal block and the electronic appliance, since the entire first connecting conductor is sealed inside the main body, it is possible to reliably prevent corrosion of the first connecting conductor, which means that it is possible to reliably prevent poor conductivity due to corrosion of the first connecting conductor.

It should be noted that the disclosure of the present invention relates to the contents of Japanese Patent Application No. 2017-126900 that was filed on Jun. 29, 2017, the entire contents of which are herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a terminal block and an electronic appliance according to the present invention will now be described with reference to the attached drawings.

Figure 1:
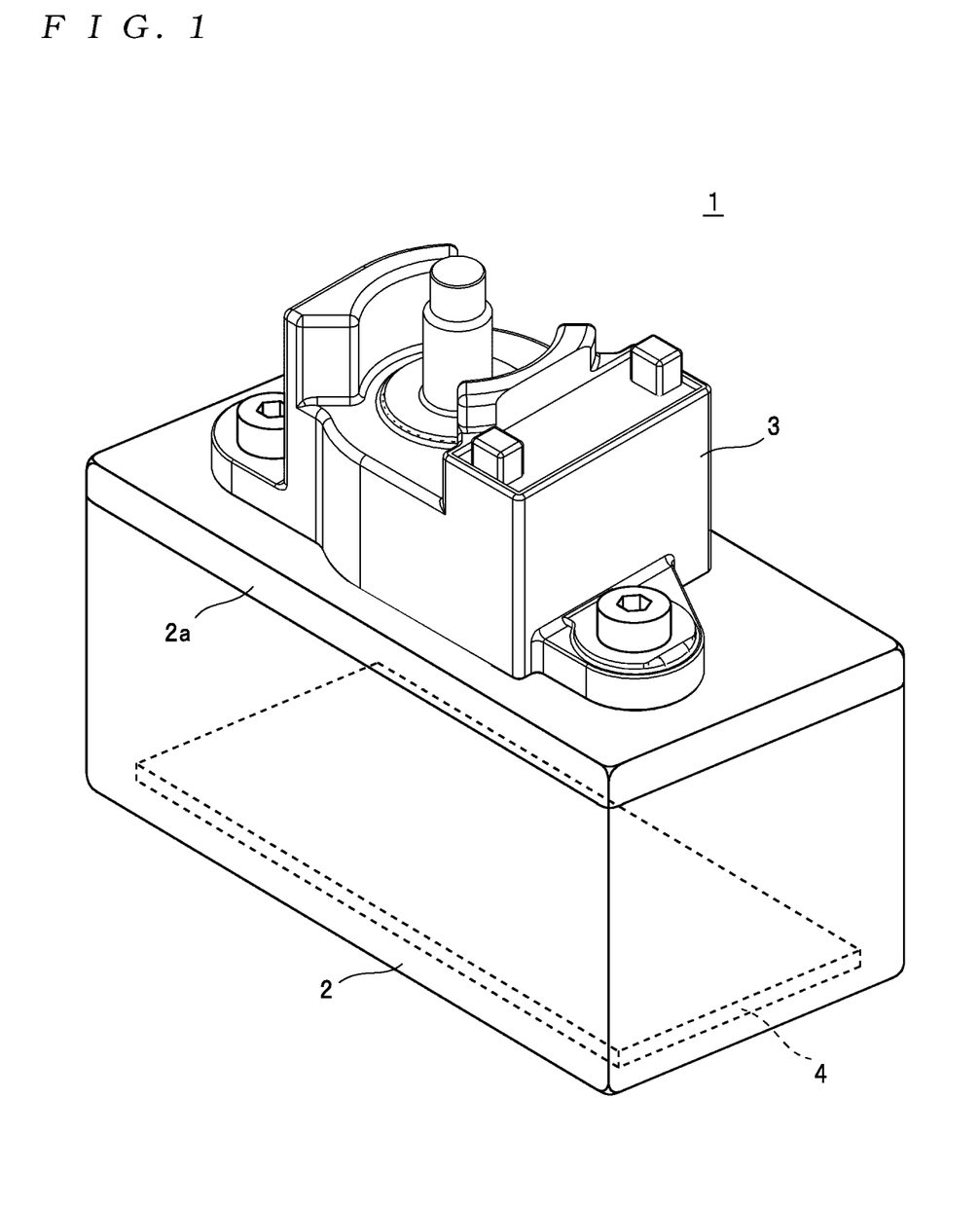
FIG. 1 is a perspective view of a power supply apparatus 1.
Figure 2:
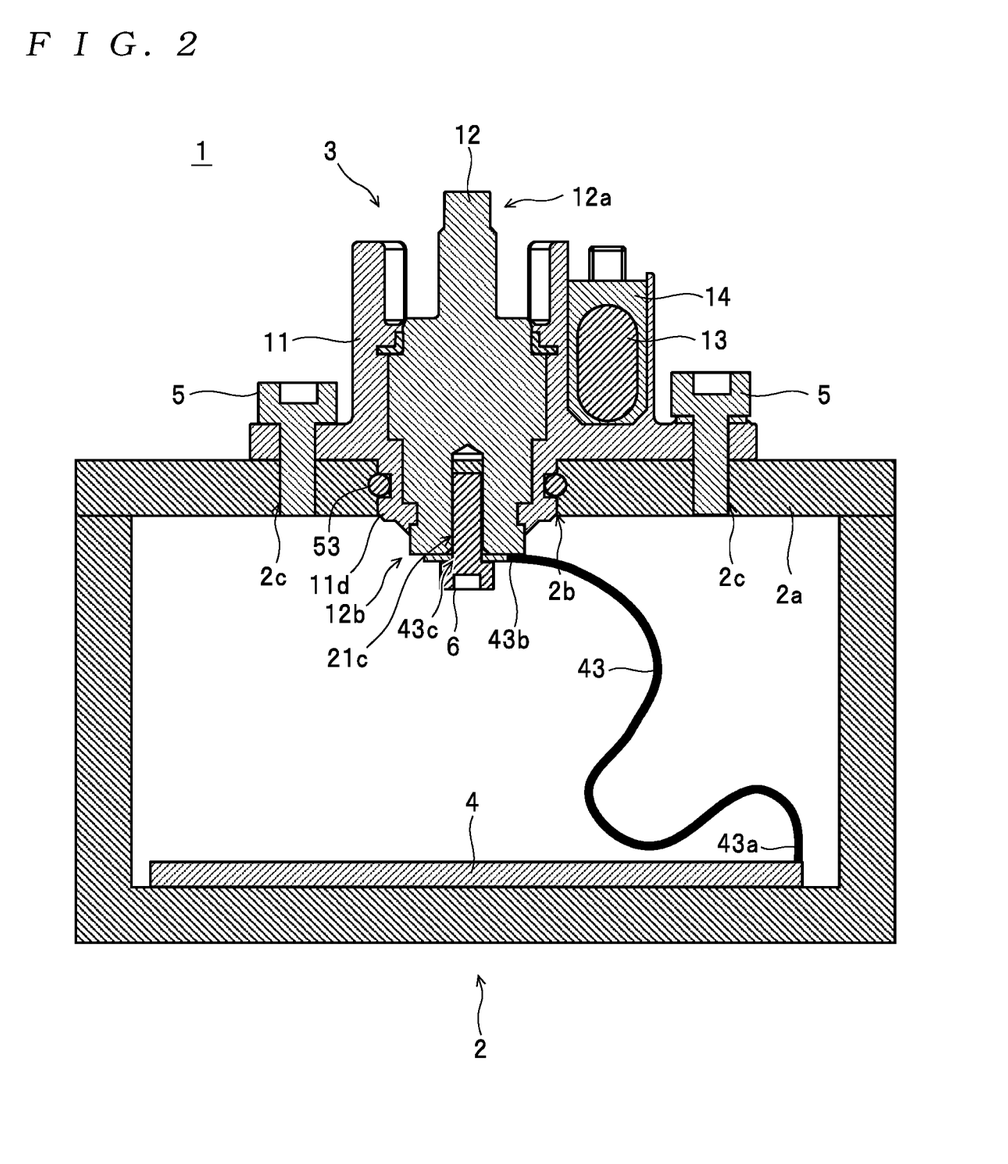
FIG. 2 is a cross-sectional view of the power supply apparatus 1.

First, the configuration of a power supply apparatus 1 depicted in FIG. 1 will be described as one example of an electronic appliance. As one example, the power supply apparatus 1 is a DC-DC converter used in an automobile. As depicted in FIGS. 1 and 2, the power supply apparatus 1 includes a case 2 (or "structure"), a terminal block 3, and an electric circuit 4.

As one example, as depicted in FIGS. 1 and 2, the case 2 is formed as a cuboid with a top plate 2a that is detachable. As one example, the case 2 is formed of resin and is configured to function as a shield by having a metal layer (or conductive layer) that corresponds to a "conductor" for the present invention formed on an inner circumferential surface thereof. Also, as depicted in FIG. 2, an opening 2b, into which a projecting portion 11d of a main body 11, described later, of the terminal block 3 and a base end 12b (or "one end") of a main terminal 12 are fitted, is formed in the top plate 2a of the case 2. Screw holes 2c into which screws 5 used to attach the terminal block 3 to the case 2 can be screwed are also formed in the top plate 2a.

Figure 3:
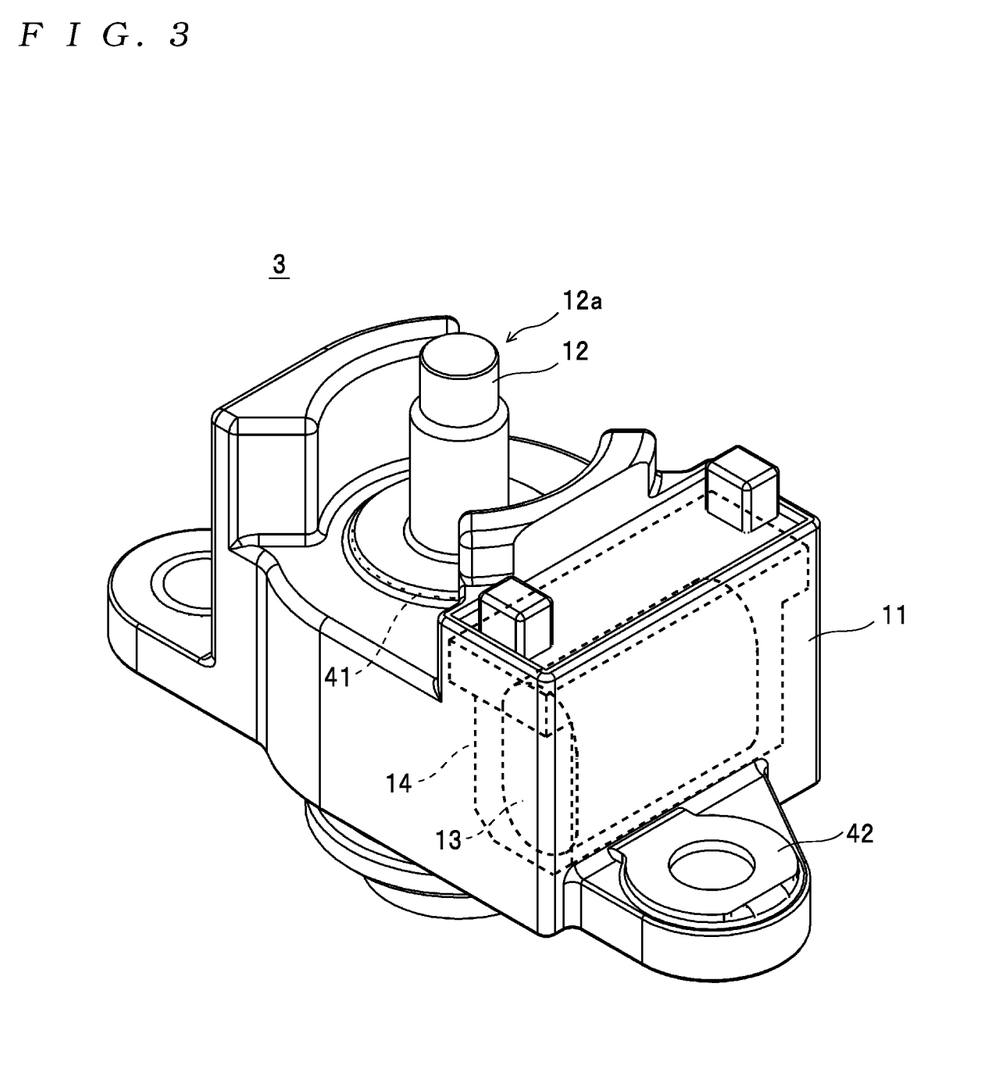
FIG. 3 is a perspective view of a terminal block 3 when looking from a front end 12a of a main terminal 12.

The terminal block 3 is an electrical component for connecting a cable (or wire harness), not illustrated, that sends electric signals outputted from the electric circuit 4 to an external appliance. As depicted in FIG. 3, the terminal block 3 includes the main body 11, the main terminal 12, a capacitor 13, a case 14, a bus bar 41 (or "first connecting conductor") and a bus bar 42 (or "second connecting conductor"). Note that in the following description, the expression "connect" means to "electrically connect".

Figure 5:
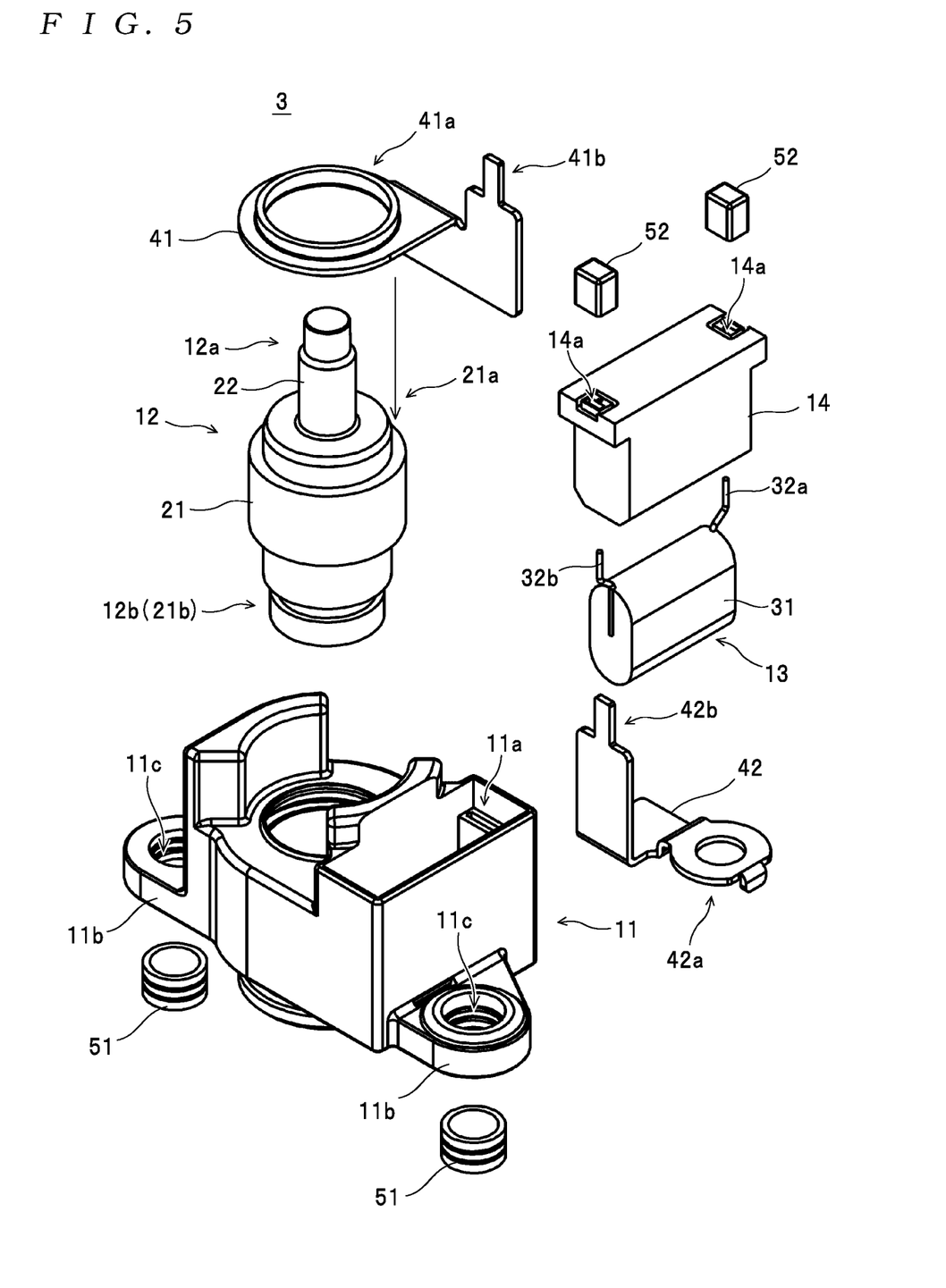
FIG. 5 is an exploded perspective view of the terminal block 3.
Figure 6:
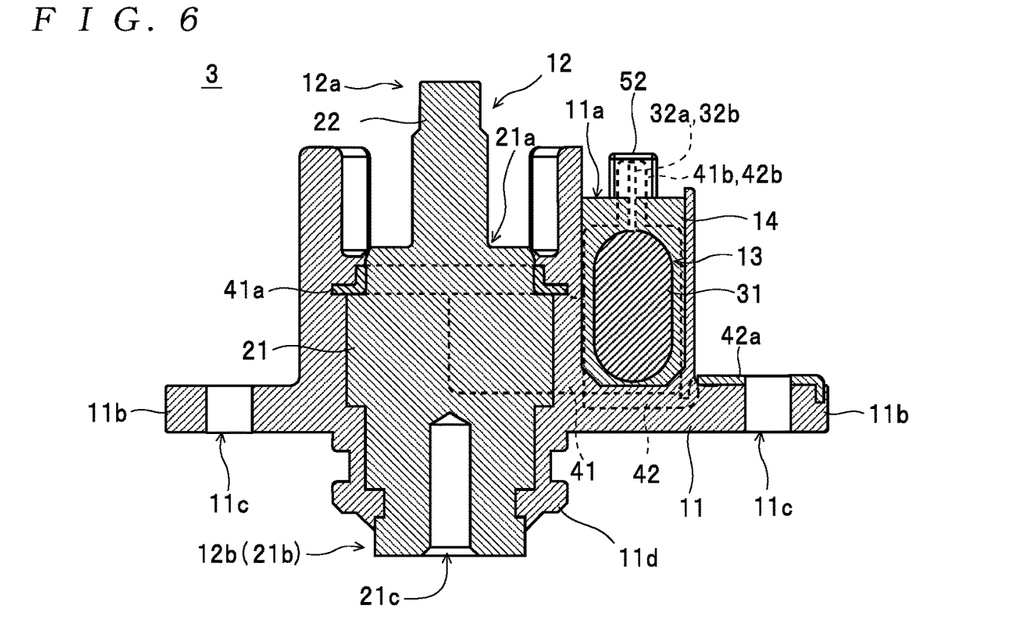
FIG. 6 is a cross-sectional view of the terminal block 3.

As depicted in FIG. 3, the main body 11 is a member that supports the main terminal 12, the capacitor 13, the case 14, and the bus bars 41 and 42, and is formed of a nonconductive resin. Also, as depicted in FIG. 5, the main body 11 is provided with a housing 11a that houses the capacitor 13 and the case 14 (i.e., the case 14 that houses the capacitor 13). As depicted in FIGS. 5 and 6, the main body 11 is also provided with two attachment portions 11b in which insertion through-holes 11c, through which the screws 5 (see FIG. 2) used to attach the terminal block 3 to the case 2 as the structure can be inserted, are formed. A conductive bushing 51 (see FIG. 5) is disposed in the respective insertion through-holes 11c of the attachment portions 11b. Also, as depicted in FIG. 6, a projecting portion 11d that supports a base end 12b of the main terminal 12 is provided at the lower part of the main body 11. With this configuration, the main body 11 is formed by insert molding where molding is performed by injecting resin into the cavity of a metal mold in a state where conductive members (more specifically, the main terminal 12, the bus bars 41 and 42, and the bushing 51) out of the members that construct the terminal block 3 have been disposed in the cavity.

Figure 4:
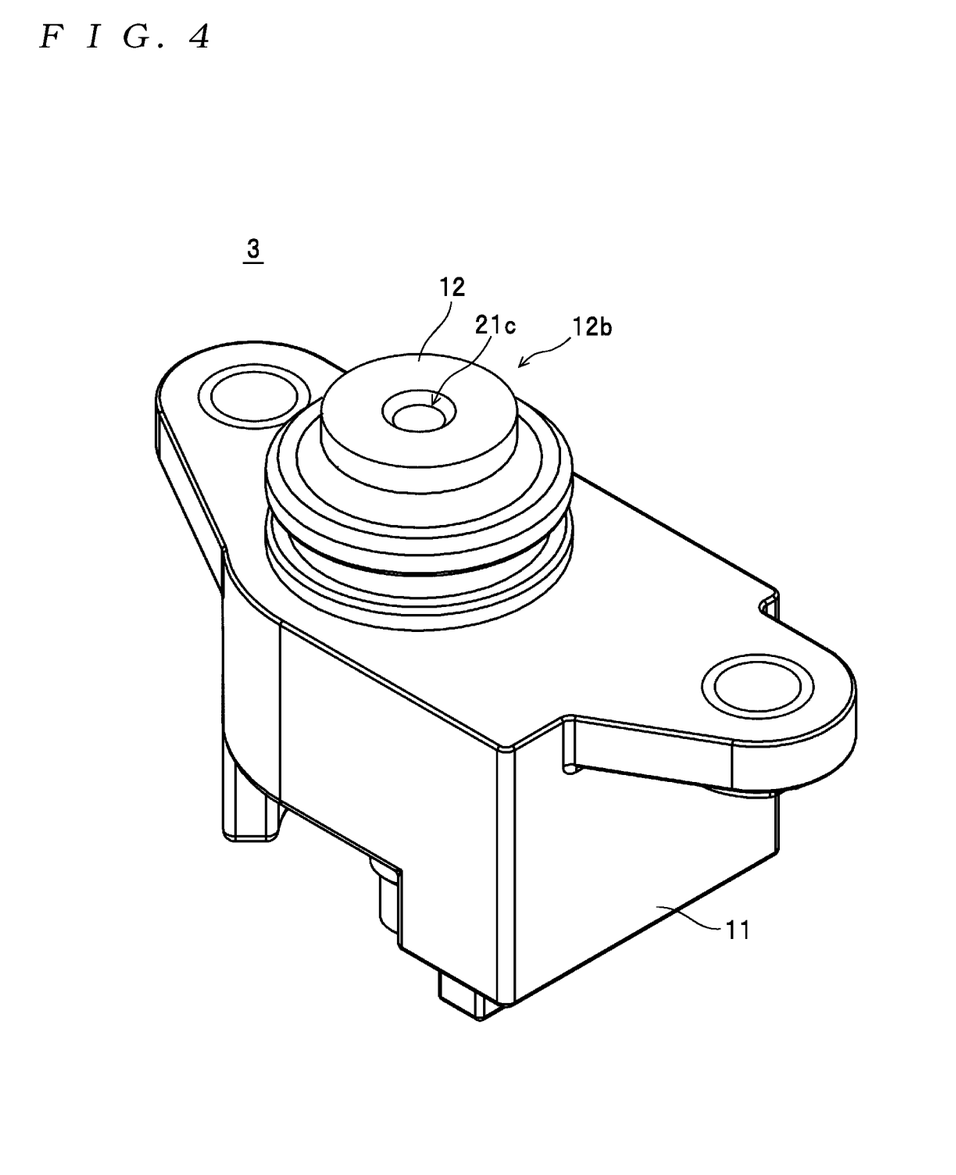
FIG. 4 is a perspective view of the terminal block 3 when looking from a base end 12b of the main terminal 12.

As depicted in FIGS. 3 and 4, the main terminal 12 passes through the main body 11 and is disposed on the main body 11 so that a front end 12a and a base end 12b project (i.e., are exposed) from the main body 11. As depicted in FIG. 5, the main terminal 12 includes a large diameter portion 21 and a small diameter portion 22 provided at a front end 21a of the large diameter portion 21, and has the overall shape of a circular pillar (more specifically, a shape that is circular in cross section when cut on a plane that is perpendicular to the length direction (or center axis)). Also, as depicted in FIG. 4, a screw hole 21c in which a screw 6 used when connecting a connection means (a cable, bus bar, or the like) 43 (or "third connecting conductor", see FIG. 2) can be screwed is formed in the base end 21b of the large diameter portion 21 (i.e., in the base end 12b of the main terminal 12). The connection means 43 is described later. A male thread (omitted from the drawings) is formed in the circumferential surface of the small diameter portion 22. As one example, the main terminal 12 is formed by performing a cutting process on a copper member as a conductive material and then subjecting the surface to metal plating (as one example, chrome plating).

As depicted in FIG. 5, the capacitor 13 includes a main body 31 and lead terminals 32a and 32b provided so as to project from the main body 31. As depicted in FIG. 6, the capacitor 13 is housed in the housing 11a of the main body 11 in a state where the capacitor 13 is housed in the case 14 (see FIG. 5 also). The lead terminal 32a (or "one lead terminal" for the present invention) is a positive electrode-side terminal and is connected via the bus bar 41, the main terminal 12, and the connection means 43 to the electric circuit 4. The lead terminal 32b (or "other lead terminal" for the present invention) is a negative electrode-side terminal and is connected via the bus bar 42 and one screw 5 to the case 2 (the reference potential). Radiation noise may be generated from the electric circuit 4 disposed inside the case 2 and superimposed on the connection means 43 disposed inside the case 2, and in this case, the capacitor 13 functions so as to remove the radiation noise outside the case 2.

As depicted in FIG. 5, the case 14 includes two insertion through-holes 14a and is configured so as to be capable of housing the main body 31 of the capacitor 13 in a state where the lead terminals 32a and 32b of the capacitor 13 pass through the respective insertion through-holes 14a and project outward. In a state where the case 14 houses the main body 31 of the capacitor 13, the case 14 is placed inside the housing 11a of the main body 11 and is fixed to the main body 11 by potting with resin from the open side of the housing 11a.

The bus bar 41 is conductive and connects the lead terminal 32a of the capacitor 13 and the main terminal 12. As one example, the bus bar 41 is formed by metal plating (for example, chrome plating) the surface of a copper plate as a conductive material that has been subjected to sheet metal processing. As depicted in FIG. 5, an end 41a (or "one end") of the bus bar 41 is formed in a ring shape (in this example, a circular ring) and is connected to the main terminal 12 by being press fitted onto the front end 21a of the large diameter portion 21 of the main terminal 12 (see FIG. 7). An end 41b (or "another end") of the bus bar 41 is connected to the lead terminal 32a (or "one lead terminal") of the capacitor 13 (see FIG. 5). As described above, the bus bar 41 is entirely sealed inside the main body 11 in a state where ends 41a and 41b have been respectively connected to the main terminal 12 and the lead terminal 32a (see FIG. 6).

In the same way as the bus bar 41, the bus bar 42 is formed by metal plating the surface of a copper plate as a conductive material that has been subjected to sheet metal processing. As depicted in FIG. 5, an end 42a (or "one end") of the bus bar 42 is formed in a circular ring and is disposed around the insertion through-hole 11c of the attachment portion 11b of the main body 11 (see FIG. 6). An end 42b (or "another end") of the bus bar 42 is connected to the lead terminal 32b (or "other lead terminal") of the capacitor 13 (see FIG. 7). As described above, a part of the bus bar 42 aside from the end 42a (i.e., a part including the connector between the lead terminal 32b and the end 42b) is sealed inside the main body 11 in a state where the end 42b has been connected to the lead terminal 32b (see FIG. 6). The bus bar 42 connects the lead terminal 32b of the capacitor 13 and the metal layer of the case 2 (i.e., a conductor of the structure) via one screw 5.

The electric circuit 4 is configured by mounting electronic components (not illustrated) such as a transformer, a switching element, a diode, an inductor, and a capacitor on a circuit board and is disposed inside the case 2 as depicted in FIGS. 1 and 2. As depicted in FIG. 2, the electric circuit 4 outputs electric signals to the main terminal 12 via the connection means 43, which is connected to the base end 12b of the main terminal 12 of the terminal block 3. Here, as one example, the electric circuit 4 boosts and outputs an inputted DC voltage.

Next, the method of assembling the power supply apparatus 1 will be described with reference to the drawings.

First, a method of fabricating the terminal block 3 will be described. When fabricating the terminal block 3, first, a molding (the molding 100 depicted in FIG. 8) that has the main terminal 12, the bus bars 41 and 42, and the bushing 51 that are the conductive members incorporated in the main body 11 (a state where the various members are supported by the main body 11) is fabricated. More specifically, as depicted in FIG. 5, the end 41a of the bus bar 41 is press fitted onto the front end 21a of the large diameter portion 21 of the main terminal 12 to integrate the main terminal 12 and the bus bar 41.

Figure 8:
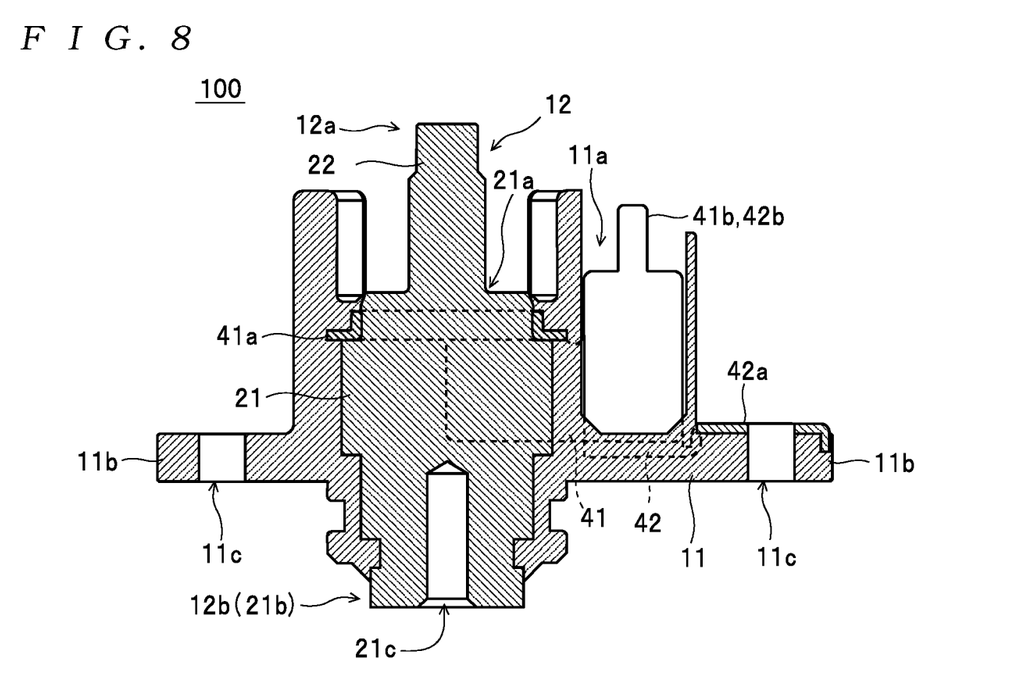
FIG. 8 is a cross-sectional view of a molding 100.

Next, the main terminal 12 and the bus bar 41 that have been integrated, the bus bar 42, and the bushing 51 are disposed at decided positions in the cavity of a mold used for insert molding that has been set in an injection molding machine. After this, the injection molding machine is operated to perform molding (insert molding) by injecting non-conductive resin into the cavity. The molding 100 is then removed from the mold. Here, as depicted in FIG. 8, the molding 100 is configured with the end 41b side of the bus bar 41 and the end 42b side of the bus bar 42 exposed inside the housing 11a of the main body 11.

After this, the lead terminals 32a and 32b of the capacitor 13 are inserted through the respective insertion through-holes 14a of the case 14 so as to project from the case 14 and the main body 31 of the capacitor 13 is housed inside the case 14. Next, the capacitor 13 whose main body 31 has been housed and the case 14 are housed in the housing 11a of the main body 11.

Figure 7:
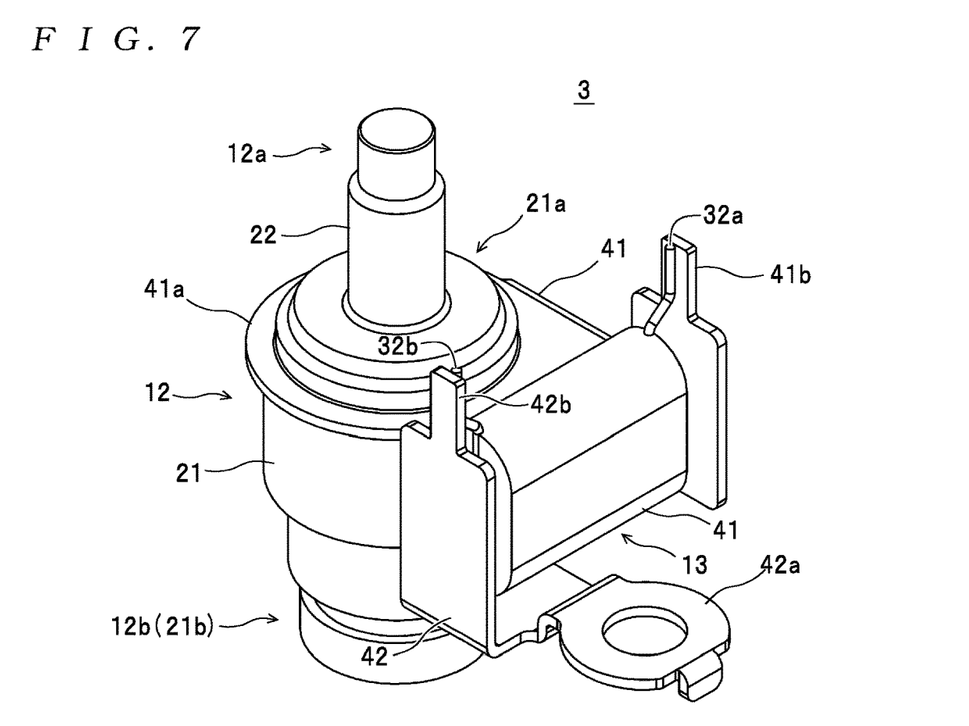
FIG. 7 is a perspective view of the terminal block 3 in a state where a main body 11 has been removed.

At this time, as depicted in FIG. 7, the end 41b of the bus bar 41 and the lead terminal 32a of the capacitor 13 are placed in contact or close to each other, and the end 42b of the bus bar 42 and the lead terminal 32b of the capacitor 13 are placed in contact or close to each other. After this, the end 41b of the bus bar 41 and the lead terminal 32a of the capacitor 13 are connected by soldering, for example, and the end 42b of the bus bar 42 and the lead terminal 32b of the capacitor 13 are connected in the same way. Next, as depicted in FIG. 6, caps 52 are attached to the connected part of the end 41b of the bus bar 41 and the lead terminal 32a of the capacitor 13 and the connected part of the end 42b of the bus bar 42 and the lead terminal 32b of the capacitor 13 (see FIG. 5 also).

After this, a flowable resin (potting material) is injected into the open side of the housing 11a so as to cover the upper surface of the case 14 and the base end of the caps 52 and then the flowable resin is hardened. By doing so, as depicted in FIG. 6, the case 14 that houses the capacitor 13 is sealed and fixed to the main body 11. In a state where the ends 41a and 41b of the bus bar 41 have been respectively connected to the main terminal 12 and the lead terminal 32a, the entire bus bar 41 is sealed inside the main body 11. Also, in a state where the end 42b of the bus bar 42 is connected to the lead terminal 32b, the part of the bus bar 42 aside from the end 42a is sealed inside the main body 11. By performing the processes described above, fabrication of the terminal block 3 is completed.

Next, as depicted in FIG. 2, the electric circuit 4 is fixed inside the internal space of the case 2. After this, as depicted in FIG. 2, the terminal block 3 is attached to the top plate 2a of the case 2. More specifically, an O-ring (or "packing") 53 for sealing purposes is attached to the projecting portion 11d of the main body 11 of the terminal block 3, and the projecting portion 11d is then fitted into the opening 2b of the top plate 2a that has been removed from the case 2. Next, the screws 5 are passed through the insertion through-holes 11c formed in the attachment portions 11b of the main body 11 of the terminal block 3, and the front ends of the screws 5 are then screwed into the screw holes 2c formed in the top plate 2a. By doing so, the terminal block 3 is attached to the top plate 2a. The lead terminal 32b of the capacitor 13 and the metal layer of the top plate 2a (i.e., the conductor of the structure) are connected via the bus bar 42 and one of the screws 5. The base end 12b of the main terminal 12 that projects from the projecting portion 11d of the main body 11 is exposed to the internal space of the case 2 from the top plate 2a.

After this, as depicted in FIG. 2, the end 43a of the connection means 43 is connected to an output terminal, not depicted, of the electric circuit 4, the screw 6 is inserted through an insertion through-hole 43c of the connection terminal provided on the end 43b of the connection means 43, and then the front end of the screw 6 is screwed into the screw hole 21c formed in the base end 12b (the base end 21b of the large diameter portion 21) of the main terminal 12. By doing so, the main terminal 12 and the electric circuit 4 are connected via the connection means 43. After this, the top plate 2a is attached to the case 2. By doing so, assembly of the power supply apparatus 1 is completed.

In this way, with the terminal block 3 and the power supply apparatus 1, the entire bus bar 41 is sealed inside the main body 11 in a state where the end 41a is connected to the main terminal 12 and the end 41b is connected to the lead terminal 32a of the capacitor 13. This means that according to the terminal block 3 and the power supply apparatus 1, unlike a configuration where the main terminal 12 is connected to the bus bar 41 by merely inserting the end 41a of the bus bar 41 into the main terminal 12 outside the main body 11, that is, a conventional configuration where the connection between the main terminal 12 and the bus bar 41 is unstable due to an inability to maintain the connected state between the main terminal 12 and the bus bar 41 when vibration and shocks are applied, it is possible to reliably maintain the connected state between the main terminal 12 and the bus bar 41 even when vibration and shocks are applied to the terminal block 3. As a result, it is possible to reliably prevent poor conduction between the main terminal 12 and the bus bar 41. Also, according to the terminal block 3 and the power supply apparatus 1, since the entire bus bar 41 is sealed inside the main body 11, it is possible to reliably prevent corrosion of the bus bar 41, which means that it is possible to reliably prevent poor conductivity due to corrosion of the bus bar 41.

Also, according to the terminal block 3 and the power supply apparatus 1, by sealing the part of the bus bar 42 that is connected to the lead terminal 32b of the capacitor 13 inside the main body 11, it is possible to reliably maintain the connection between the bus bar 42 and the lead terminal 32b even when vibration and shocks are applied to the terminal block 3. As a result, it is possible to reliably prevent poor conductivity between the bus bar 42 and the lead terminal 32b.

Also, according to the terminal block 3 and the power supply apparatus 1, by disposing the end 42a (or "one end") of the bus bar 42 on the attachment portion 11b that is provided on the main body 11 to attach the main body 11 to the case 2, it is possible, by fixing the attachment portion 11b to the case 2 using one of the screws 5, to connect the end 42a of the bus bar 42 to the metal layer of the case 2 (i.e., the conductor of the structure) via the screw 5. That is, attachment of the main body 11 to the case 2 and the connecting of the end 42a of the bus bar 42 and the metal layer of the case 2 can be performed in a single operation. This means that according to the terminal block 3 and the power supply apparatus 1, since it is possible to make a task that separately connects the end 42a and the metal layer of the case 2 using a conductive wire or the like unnecessary, it is possible to sufficiently improve the manufacturing efficiency of the terminal block 3.

Also, with the terminal block 3 and the power supply apparatus 1, the main terminal 12 is formed in the overall shape of a circular pillar. Here, with insert molding where molding is performed by injecting resin in the periphery of components that have flat surfaces, it is known that it is easy for gaps to form at the boundaries between the flat surfaces of the components and the resin due to spews in the resin. This means that when the main terminal 12 is formed in a shape with flat surfaces (for example, a rectangular cylinder), there is the risk of corrosion to the main terminal 12 due to water infiltration from the gaps produced at the boundaries between the flat surfaces of the components and the resin. On the other hand, according to the terminal block 3 and the power supply apparatus 1, by forming the main terminal 12 in the overall shape of a circular pillar, since the boundary between the main terminal 12 and the resin is a curved surface (circumferential surface), it is possible to suppress the production of gaps at the boundary, and as a result, it is possible to prevent corrosion of the main terminal 12 due to water infiltration from gaps.

According to the terminal block 3 and the power supply apparatus 1, by forming the end 41a of the bus bar 41 in a ring shape (in the present embodiment, a circular ring shape) and connecting the bus bar 41 to the main terminal 12 by press fitting the ring-shaped end 41a onto the main terminal 12, it is possible to reliably connect the bus bar 41 and the main terminal 12, which means that it is possible to reliably prevent poor conductivity between the main terminal 12 and the bus bar 41. Also, since it is possible to reliably connect the main terminal 12 and the bus bar 41 with a simple operation of merely press fitting the end 41a onto the main terminal 12, it is possible to sufficiently improve the productivity of the process that connects the main terminal 12 and the bus bar 41.

Note that the terminal block and the electronic appliance according to the present invention are not limited to the terminal block 3 and the power supply apparatus 1 described above. As one example, although an example where the capacitor 13 is housed in the housing 11a of the main body 11 having been housed in the case 14 is described above, it is also possible to apply the present invention to a configuration where the capacitor 13 is directly housed in the housing 11a of the main body 11 without using the case 14.

Also, although an example where the terminal block 3 is fabricated by fabricating the molding 100 where various conductive members are incorporated in the main body 11 by insert molding, housing the capacitor 13 and the case 14 in the housing 11a of the main body 11, and then fixing the capacitor 13 and the case 14 to the main body 11 using potting resin has been described above, it is also possible to perform insert molding with the capacitor 13 and the case 14 placed inside the cavity of the mold together with the various conductive members.

Although an example that uses the case 2 that is formed of resin and functions as a shield by having a metal layer formed on the inner circumferential surface has been described above, it is also possible to use a case 2 that functions as a shield by being formed of metal plates. It is also possible to use a case 2 that does not have a function as a shield (that is, a nonconductive case that does not conduct electricity).

Also, although an example where the main terminal 12 that is formed in the overall shape of a circular pillar (i.e., a shape that is circular in cross section) has been described above, it is also possible to use a main terminal 12 of another shape. As specific examples, it is possible to use a main terminal 12 in the form of a pillar that is oval in cross-section and a main terminal 12 in the form of a pillar whose cross-sectional form is a combination of curved edges. When a main terminal 12 with a shape aside from a circular pillar is used, by forming the end 41a of the bus bar 41 as a ring with a shape that corresponds to the cross-sectional form of the main terminal 12, it is possible to press fit the end 41a onto the main terminal 12.

Although an example where the connected part of the end 42b of the bus bar 42 and the lead terminal 32b of the capacitor 13 is sealed inside the main body 11 has been described, it is also possible to apply the present invention to a configuration where the end 42*b* of the bus bar 42 and the lead terminal 32*b* of the capacitor 13 are connected outside the main body 11.

Although an example where the end 42*a* of the bus bar 42 is disposed on the attachment portion 11*b* to attach the main body 11 to the case 2 and the end 42*a* is connected to the metal layer of the case 2 (that is, the conductor of the structure) via one of the screws 5 that attaches the main body 11 to the case 2 has been described above, it is also possible to apply the present invention to a configuration where the end 42*a* is disposed at a position aside from the attachment portion 11*b* and the end 42*a* and the metal layer of the case 2 are connected using wires or the like.

Also, although an example configuration equipped with only one main terminal 12 has been described above, it is also possible to apply the present invention to a configuration with a plurality of main terminals 12. Here, for a configuration equipped with two main terminals 12 for example, the capacitor 13 and connecting conductors are sealed inside the main body 11 in a state where one of the main terminals 12 is connected via a connecting conductor to one of the lead terminals 32*a* and 32*b* of the capacitor 13 and the other of the main terminals 12 is connected via a connecting conductor to the other of the lead terminals 32*a* and 32*b* of the capacitor 13. By using this configuration, it is possible to reliably maintain the connections between the main terminals 12 and the connecting conductors and the connections between the lead terminals 32*a* and 32*b* and the connecting conductors. Also, for an example configuration equipped with three or more main terminals 12, by disposing a plurality of capacitors 13 whose lead terminals 32*a* and 32*b* are connected via connecting conductors to two adjacent main terminals 12 and sealing the capacitors 13 and the connecting conductors inside the main body 11, it is possible, in the same way as the configuration with two main terminals 12, to reliably maintain the connections between the respective main terminals 12 and the connecting conductors and the connections between the respective lead terminals 32*a* and 32*b* and the connecting conductors.

Although an example where the present invention is applied to a power supply apparatus 1 (a DC-DC converter) as an electronic appliance has been described above, it is also possible to apply the present invention to various electronic appliances aside from a DC-DC converter (as examples, an AC-DC converter and an inverter).

Moreover, the invention encompasses any possible combination of some or all of the various embodiments and the modification examples described herein and incorporated herein.

It is possible to achieve at least the following configurations from the above-described example embodiments and the modification examples of the disclosure.

(1) A terminal block comprising:
   a nonconductive main body that is attached to a structure;
   a main terminal that is conductive, passes through the main body, and is disposed on the main body so that both ends of the main terminal project from the main body;
   a capacitor that is sealed inside the main body;
   a first connecting conductor that connects one lead terminal of the capacitor and the main terminal; and
   a second connecting conductor that connects another lead terminal of the capacitor and a conductor of the structure,
   wherein the first connecting conductor is entirely sealed inside the main body in a state where one end is connected to the main terminal and another end is connected to the one lead terminal of the capacitor.

(2) The terminal block according to (1),
   wherein a part of the second connecting conductor connected to the other lead terminal is sealed inside the main body.

(3) The terminal block according to (1) or (2),
   wherein one end of the second connecting conductor is disposed on an attachment portion, which is provided on the main body in order to attach the main body to the structure.

(4) The terminal block according to any of (1) to (3),
   wherein the main terminal is formed in an overall shape of a circular pillar.

(5) The terminal block according to any of (1) to (4),
   wherein the one end of the first connecting conductor is formed in a ring shape and one end of the ring shape is press fitted to the main terminal to connect the first connecting conductor to the main terminal.

(6) An electronic appliance comprising:
   the terminal block according to any of (1) to (5),
   a case as the structure to which the terminal block is attached; and
   an electric circuit disposed inside the case,
   wherein one end of the main terminal is exposed to an internal space of the case and is connected via a third connecting conductor to the electric circuit.

What is claimed is:

1. A terminal block comprising:
   a nonconductive main body that is attached to a structure;
   a main terminal that is conductive, passes through the main body, and is disposed on the main body so that both ends of the main terminal project from the main body;
   a capacitor that is sealed inside the main body;
   a first connecting conductor that connects one lead terminal of the capacitor and the main terminal; and
   a second connecting conductor that connects another lead terminal of the capacitor and a conductor of the structure,
   wherein the first connecting conductor is entirely sealed inside the main body in a state where one end is connected to the main terminal and another end is connected to the one lead terminal of the capacitor, and
   wherein the one end of the first connecting conductor is formed in a ring shape and one end of the ring shape is press fitted to the main terminal to connect the first connecting conductor to the main terminal.

2. The terminal block according to claim 1,
   wherein a part of the second connecting conductor connected to the other lead terminal is sealed inside the main body.

3. The terminal block according to claim 2,
   wherein one end of the second connecting conductor is disposed on an attachment portion, which is provided on the main body in order to attach the main body to the structure.

4. The terminal block according to claim 3,
   wherein the main terminal is formed in an overall shape of a circular pillar.

5. The terminal block according to claim 2,
   wherein the main terminal is formed in an overall shape of a circular pillar.

6. An electronic appliance comprising:
   the terminal block according to claim 2,
   a case as the structure to which the terminal block is attached; and
   an electric circuit disposed inside the case,
   wherein one end of the main terminal is exposed to an internal space of the case and is connected via a third connecting conductor to the electric circuit.

7. The terminal block according to claim 1,
wherein one end of the second connecting conductor is disposed on an attachment portion, which is provided on the main body in order to attach the main body to the structure.

8. The terminal block according to claim 7,
wherein the main terminal is formed in an overall shape of a circular pillar.

9. An electronic appliance comprising:
the terminal block according to claim 7,
a case as the structure to which the terminal block is attached; and
an electric circuit disposed inside the case,
wherein one end of the main terminal is exposed to an internal space of the case and is connected via a third connecting conductor to the electric circuit.

10. The terminal block according to claim 1,
wherein the main terminal is formed in an overall shape of a circular pillar.

11. An electronic appliance comprising:
the terminal block according to claim 10,
a case as the structure to which the terminal block is attached; and
an electric circuit disposed inside the case,
wherein one end of the main terminal is exposed to an internal space of the case and is connected via a third connecting conductor to the electric circuit.

12. An electronic appliance comprising:
the terminal block according to claim 1,
a case as the structure to which the terminal block is attached; and
an electric circuit disposed inside the case,
wherein one end of the main terminal is exposed to an internal space of the case and is connected via a third connecting conductor to the electric circuit.

13. An electronic appliance comprising:
a terminal block including:
  a nonconductive main body that is attached to a structure,
  a main terminal that is conductive, passes through the main body, and is disposed on the main body so that both ends of the main terminal project from the main body,
  a capacitor that is sealed inside the main body,
  a first connecting conductor that connects one lead terminal of the capacitor and the main terminal, and
  a second connecting conductor that connects another lead terminal of the capacitor and a conductor of the structure,
  wherein the first connecting conductor is entirely sealed inside the main body in a state where one end is connected to the main terminal and another end is connected to the one lead terminal of the capacitor;
a case as the structure to which the terminal block is attached; and
an electric circuit disposed inside the case,
wherein one end of the main terminal is exposed to an internal space of the case and is connected via a third connecting conductor to the electric circuit.

14. An electronic appliance comprising:
a terminal block including:
  a nonconductive main body that is attached to a structure,
  a main terminal that is conductive, passes through the main body, and is disposed on the main body so that both ends of the main terminal project from the main body,
  a capacitor that is sealed inside the main body,
  a first connecting conductor that connects one lead terminal of the capacitor and the main terminal, and
  a second connecting conductor that connects another lead terminal of the capacitor and a conductor of the structure,
  wherein the first connecting conductor is entirely sealed inside the main body in a state where one end is connected to the main terminal and another end is connected to the one lead terminal of the capacitor, and
  wherein a part of the second connecting conductor connected to the other lead terminal is sealed inside the main body;
a case as the structure to which the terminal block is attached; and
an electric circuit disposed inside the case,
wherein one end of the main terminal is exposed to an internal space of the case and is connected via a third connecting conductor to the electric circuit.

* * * * *